United States Patent
Huang et al.

(10) Patent No.: US 10,923,388 B2
(45) Date of Patent: Feb. 16, 2021

(54) GAP FILL VOID AND CONNECTION STRUCTURES

(71) Applicant: GLOBALFOUNDRIES INC., Grand Cayman (KY)

(72) Inventors: Haigou Huang, Rexford, NY (US); Yuping Ren, Clifton Park, NY (US); Paul Ackmann, Gansevoort, NY (US); Guoxiang Ning, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/252,114

(22) Filed: Jan. 18, 2019

(65) Prior Publication Data
US 2020/0235002 A1    Jul. 23, 2020

(51) Int. Cl.
| H01L 21/768 | (2006.01) |
| H01L 21/027 | (2006.01) |
| H01L 21/283 | (2006.01) |
| H01L 21/311 | (2006.01) |

(52) U.S. Cl.
CPC .... *H01L 21/76808* (2013.01); *H01L 21/0276* (2013.01); *H01L 21/283* (2013.01); *H01L 21/311* (2013.01); *H01L 21/76814* (2013.01); *H01L 21/76816* (2013.01); *H01L 21/76879* (2013.01)

(58) Field of Classification Search
CPC ......... H01L 21/76808; H01L 21/76879; H01L 21/283
See application file for complete search history.

(56) References Cited

U.S. PATENT DOCUMENTS

| 8,871,651 B1 | 10/2014 | Choi et al. |
| 9,023,688 B1 | 5/2015 | Or-Bach et al. |
| 9,245,791 B2 | 1/2016 | Lin et al. |
| 9,305,832 B2 | 4/2016 | Hu et al. |
| 9,634,088 B1 | 4/2017 | Thees et al. |
| 9,842,845 B1 | 12/2017 | Melde et al. |
| 2013/0193489 A1* | 8/2013 | Baars ................ H01L 21/28518 257/213 |
| 2019/0267279 A1* | 8/2019 | Cheng ................. H01L 21/7682 |
| 2019/0334008 A1* | 10/2019 | Chen ................. H01L 29/66795 |
| 2019/0378909 A1* | 12/2019 | Cheng ................. H01L 21/7682 |

* cited by examiner

*Primary Examiner* — Jay C Chang
*Assistant Examiner* — Mikka Liu
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to gap fill void and connection structures and methods of manufacture. The structure includes: a gate structure comprising source and drain regions; a gate contact in direct contact and overlapping the gate structure; and source and drain contacts directly connecting to the source and drain regions, respectively.

18 Claims, 5 Drawing Sheets

GAP FILL VOID AND CONNECTION STRUCTURES

FIELD OF THE INVENTION

The present disclosure relates to semiconductor structures and, more particularly, to gap fill void and connection structures and methods of manufacture.

BACKGROUND

As semiconductor devices continue to scale downwards, e.g., shrink, the desired spacing between features (i.e., the pitch) also becomes smaller. To this end, in the smaller technology nodes, it becomes ever more difficult to fabricate features due to the critical dimension (CD) scaling and process capabilities. For example, it becomes difficult to align features, e.g., contacts, due to process capabilities and variabilities. The misalignment of the contacts may result in unlanded features which can result in back gate shorts on gate contacts landing on narrow gate structures.

SUMMARY

In an aspect of the disclosure, a structure comprises: a gate structure comprising source and drain regions; a gate contact in direct contact and overlapping the gate structure; and source and drain contacts directly connecting to the source and drain regions, respectively.

In an aspect of the disclosure, a method comprises: forming a plurality of gate structures each comprising source and drain regions; forming an interlevel dielectric stack of material over the plurality of gate structures; forming a first set of openings in the interlevel dielectric stack of material to simultaneously expose the source and drain regions, and expose and overlap at least one of the plurality of gate structures; filling the first set of openings with material; forming a second set of openings in an upper material of the interlevel dielectric stack of material, aligned with the filled first set of openings; filling the second set of openings with material; removing the material from each of the first set and second set of openings; lining the each of the first set and second set of openings with a liner material; and filling each of the first set and second set of openings with contact material.

In an aspect of the disclosure, a method comprises: forming a plurality of gate structures each comprising source and drain regions; forming an interlevel dielectric stack of material over the plurality of gate structures; forming at least one opening in the interlevel dielectric stack of material to expose and overlap with at least one of the plurality of gate structures; filling the at least one opening with a material; forming additional openings in the interlevel dielectric stack of material to expose the source and drain regions, while the at least one opening is filled with the material; filling the additional openings with the material; forming a larger opening in an upper material of the interlevel dielectric stack of material; removing the material from the least one opening and the additional openings; lining sidewalls of each of each of the openings with a liner material; and filling each of the openings with contact material, which contacts the source and drain regions and the at least one of the plurality of gate structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to gap fill void and connection structures and methods of manufacture. More specifically, the present disclosure describes extreme ultraviolet lithography (EUV) or deep ultraviolet lithography (DUV) process schemes used in fully-depleted silicon-on-insulator (FDSOI) gap fill void and connection structures. The EUV or DUV process schemes disclosed herein provide middle of the line contacts to the source/drain regions and the gate structures. Advantageously, the EUV or DUV process schemes described herein widen a process window (e.g., reduces the aspect ratio to increase a RIE process margin) to avoid unlanding issues for the source/drain and gate contacts, while also reducing shorting issues due to voids.

The gap fill void and connection structures of the present disclosure can be manufactured in a number of ways using a number of different tools. In general, though, the methodologies and tools are used to form structures with dimensions in the micrometer and nanometer scale. The methodologies, i.e., technologies, employed to manufacture the gap fill void and connection structures of the present disclosure have been adopted from integrated circuit (IC) technology. For example, the structures are built on wafers and are realized in films of material patterned by photolithographic processes on the top of a wafer. In particular, the fabrication of the gap fill void and connection structures uses three basic building blocks: (i) deposition of thin films of material on a substrate, (ii) applying a patterned mask on top of the films by photolithographic imaging, and (iii) etching the films selectively to the mask.

Figure 1:
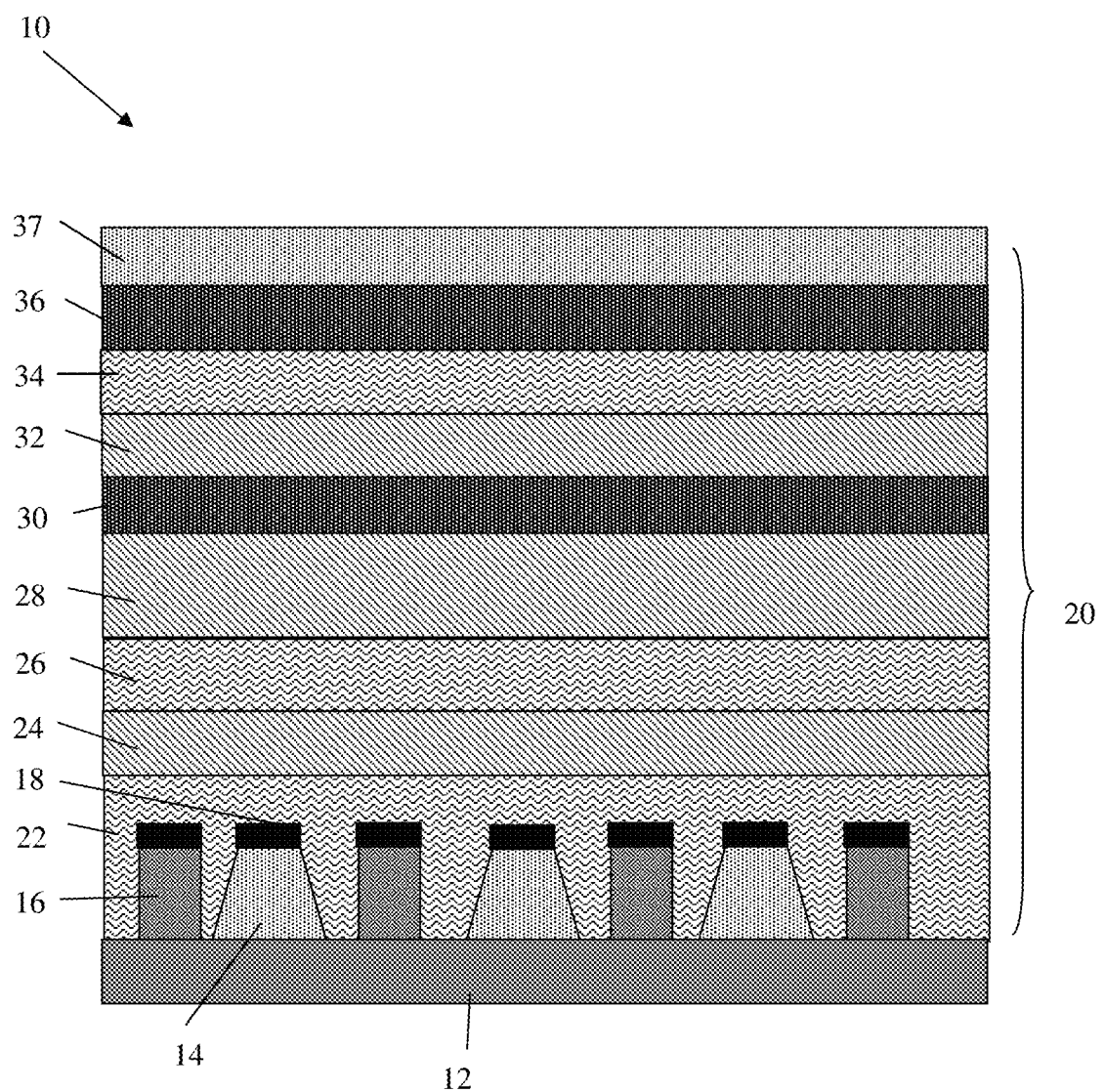
FIG. 1 shows gate structures with source and drain regions, amongst other features, and respective fabrication processes in accordance with aspects of the present disclosure.

FIG. 1 shows gate structures with source and drain regions, amongst other features, and respective fabrication processes using EUV in accordance with aspects of the present disclosure. The structure 10 of FIG. 1 includes a fully depleted semiconductor on insulator (FDSOI) substrate 12. In embodiments, the substrate 12 may be composed of any suitable material including, but not limited to, Si, SiGe, SiGeC, SiC, GaAs, InAs, InP, and other III/V or II/VI compound semiconductors. In further embodiments, the substrate 12 can be representative of a fin structure fabricated using conventional deposition, lithography and etching processes including, e.g., sidewall image techniques (SIT).

In the SIT technique, for example, a mandrel material, e.g., $SiO_2$, is deposited on the substrate 12 using conventional CVD processes. A resist is formed on the mandrel material and exposed to light to form a pattern (openings). A reactive ion etching (RIE) is performed through the openings to form the mandrels. In embodiments, the mandrels can have different widths and/or spacing depending on the desired dimensions between the fin structures. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features, i.e., fins. The sidewall spacers can then be stripped. In embodiments, the fin structures can also be formed through other conventional patterning processes as contemplated by the present disclosure.

Still referring to FIG. 1, diffusion regions (e.g., source and drain regions) 14 are formed on the substrate 12. In embodiments, the source and drain regions 14 can be raised source and drain regions formed by conventional epitaxial growth processes. In embodiments, the source and drain regions 14 can be doped or ion implanted with dopants, e.g., boron, arsenic, phosphorous, etc., to form the appropriate diffusion regions. Gate structures (e.g., devices) 16 are formed on the substrate 12 using conventional deposition, lithography and etching processes known to those of skill in the art such that no further explanation is required herein for a complete understanding of the present disclosure. In embodiments, the gate structures 16 can be formed by a first gate process or a replacement gate process as are known to those of ordinary skill in the art.

In embodiments, silicide contacts 18 are formed on the source and drain regions 14, as well on the gate structures 16. As should be understood by those of skill in the art, the silicide process begins with deposition of a thin transition metal layer, e.g., nickel, cobalt or titanium, over fully formed and patterned semiconductor devices (e.g., doped or ion implanted source and drain regions 14 and respective devices 16). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 18 in the active regions of the device. It should be understood by those of skill in the art that silicide contacts will not be required on the devices, when a gate structure is composed of a metal material.

A middle of line (MOL) interlevel dielectric stack of material 20 is deposited on the structure, e.g., over the source/drain regions 14 and structures 16. In embodiments, the stack of material can include, e.g., SiN 22, tetraethoxysilane (TEOS) 24, SiN 26, TEOS 28, SOH 30, oxide 32, SiN 34, SOH 36 and SiOH 37. In embodiments, each material of the stack of material 20 can be deposited by any conventional deposition method including, e.g., chemical vapor deposition (CVD) processes. Although not critical to an understanding of the present disclosure, the stack of material 20 can include other materials and can have a thickness of about 500 nm; although other dimensions are also contemplated herein.

Figure 2:
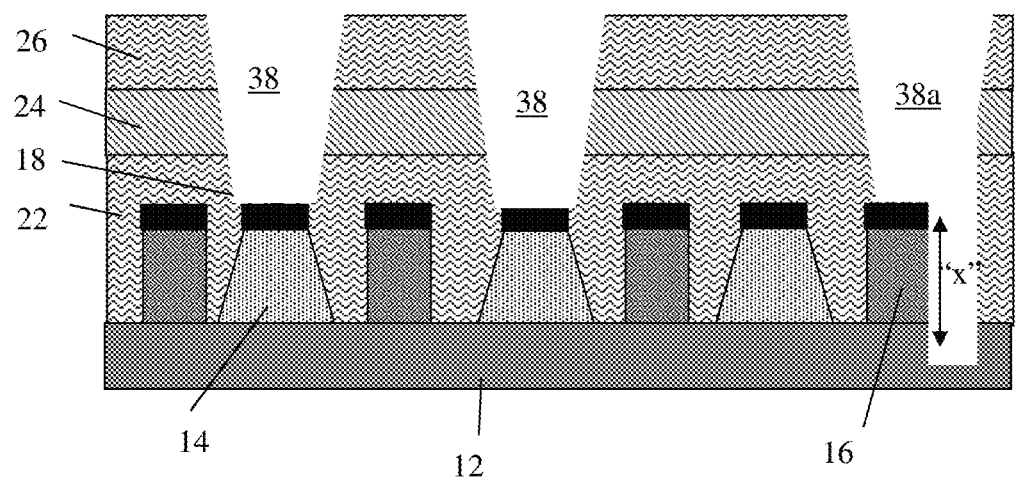
FIG. 2 shows trenches overlapping and exposing the gate structures and source and drain regions, amongst other features, and respective fabrication processes in accordance with aspects of the present disclosure.

In FIG. 2, trenches 38, 38a are simultaneously formed to expose the source and drain regions 14 (e.g., silicide 18) and the gate structure 16. In embodiments, the trenches 38, 38a are formed by an EUV lithography process scheme followed by an etching (RIE) process scheme. For example, a resist formed over the material 37 is exposed to energy (light) to form a pattern (opening). An etching process with selective chemistries, e.g., reactive ion etching (RIE), will be used to form one or more trenches 38, 38a in the stack of materials 20 through the openings of the resist. The resist can then be removed by a conventional oxygen ashing process or other known stripants.

In embodiments, the trenches 38 land on the source and drain regions 14; whereas, the trench 38a lands on and overlaps the gate structure 16, extending into the underlying substrate 12. In embodiments, the trenches 38, 38a can have a larger critical dimension, e.g., about 2 nm to about 10 nm in width, compared to conventional processes of record. This larger critical dimension will ensure that the trenches 38, 38a land on both the source/drain regions 14 and the gate structure 16. In embodiments, the trench 38a can have a depth "x" of 100 nm or more, beyond a top surface of the gate structure 16. During the etching process, the materials 28-37 are also removed.

Figure 3:
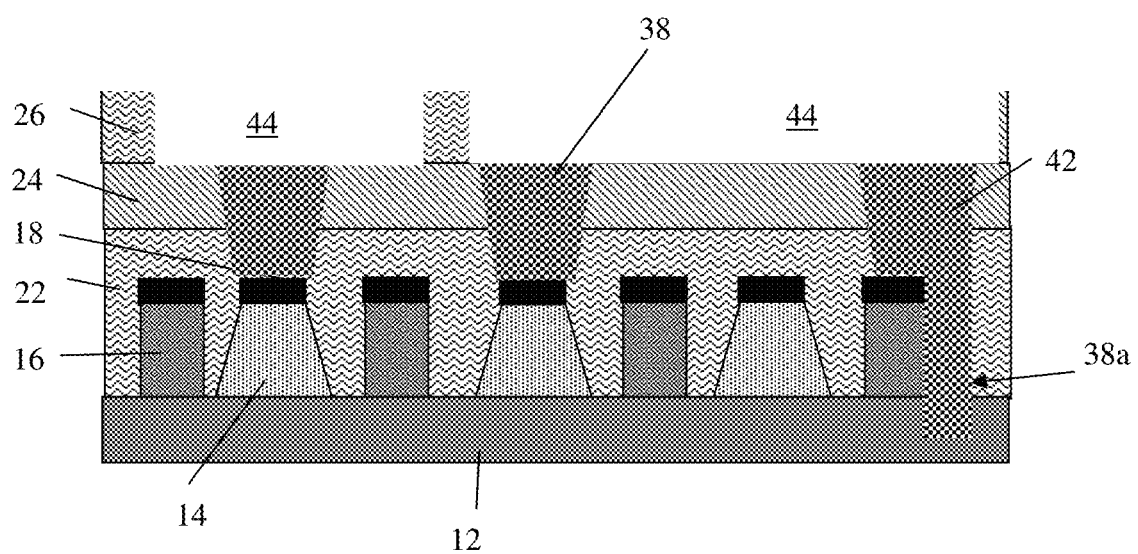
FIG. 3 shows material in the trenches, amongst other features, and respective fabrication processes in accordance with aspects of the present disclosure.

As shown in FIG. 3, the trenches 38, 38a are filled with material 42. In embodiments, the material 42 can be SOH, as an example. The material 42 can be deposited by any conventional deposition method, e.g., CVD, atomic layer deposition (ALD) or plasma enhanced CVD (PECVD), amongst other deposition processes. After the deposition of the material 42, lithography and etching (RIE) processes are performed to form openings 44 in the material 26, which are widen than the upper portions of the trenches (now filled with the material 42). In embodiments, the openings 44 will enlarge the trenches 38, 38a by about an additional, e.g., 2 nm to 10 nm in width. After the etching process, the resist can be removed by a conventional oxygen ashing process or other known stripants followed by a known cleaning process.

Figure 4:
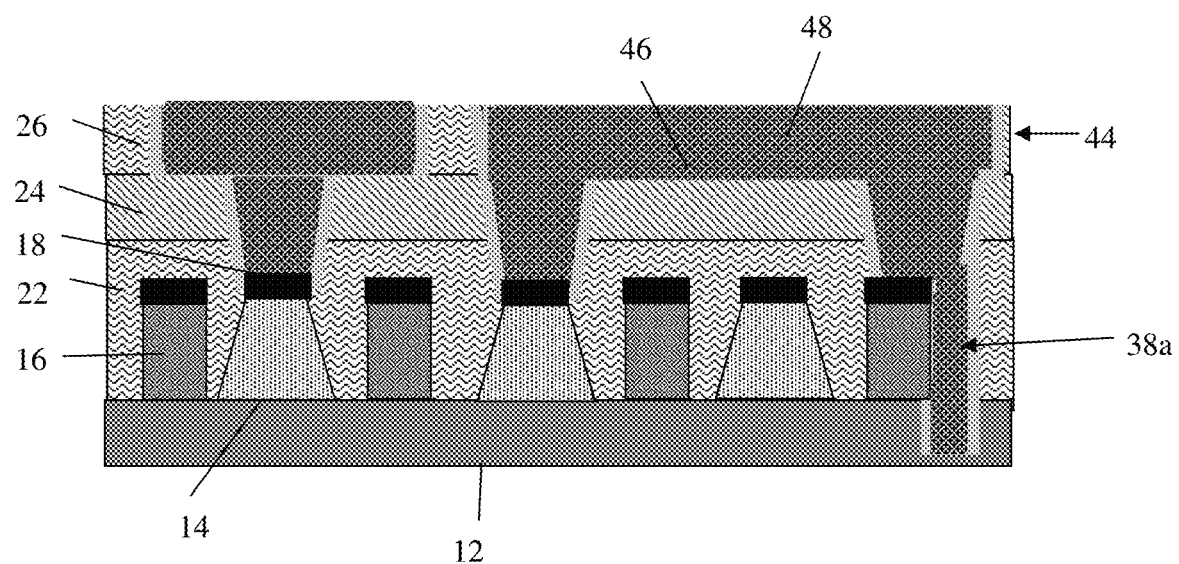
FIG. 4 shows source/drain and gate contacts, amongst other features, and respective fabrication processes in accordance with aspects of the present disclosure.

As shown in FIG. 4, the material 42 is removed using an etching process with a selective chemistry. A liner 46 is then deposited on the surfaces of the trenches 38, 38a and openings 44. The liner 46 can be deposited to a thickness of about, e.g., 2 nm to about 20 nm and more preferably about 2 nm to about 10 nm in width. The liner 46 can be SiN, oxide, nitride or TEOS, as examples, deposited using conventional deposition methods, e.g., CVD or ALD. The liner 46 is subjected to an anisotropic etching process, leaving the liner 46 on sidewalls of the trenches 38 opening 44.

Still referring to FIG. 4, a metallization 48 is deposited on the liner 46 and in direct contact with the silicide 18 of the source and drain regions 14 in trench 38 to form a middle of line source/drain contact, and the gate structures 16 in trench 38a to form a middle of line gate contact. In embodiments, the metallization 48 (contact material) will overlap with the gate structure 16 ensuring a landed and aligned contact. The metallization 48 can be a tungsten material deposited by a conventional CVD process, followed by a planarization process, e.g., chemical mechanical polishing (CMP). In this way, the metallization 48 is lined by the liner 46 which will avoid shorting issues.

Figure 5:
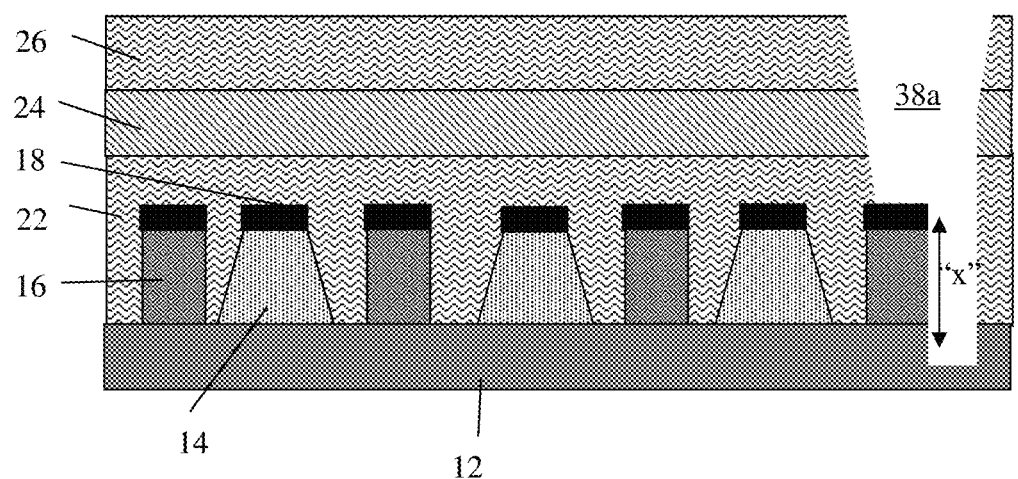
FIGS. 5-7 shows contacts to gate structures and source and drain regions, amongst other features, and respective fabrication processes using deep ultraviolet lithography (DUV) processes in accordance with aspects of the present disclosure.
Figure 6:
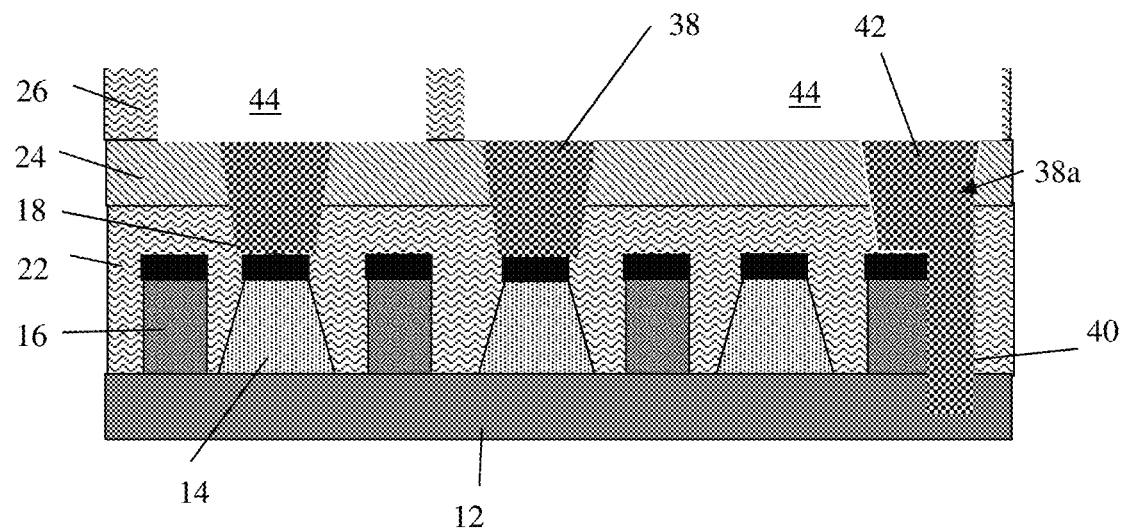
Figure 7:
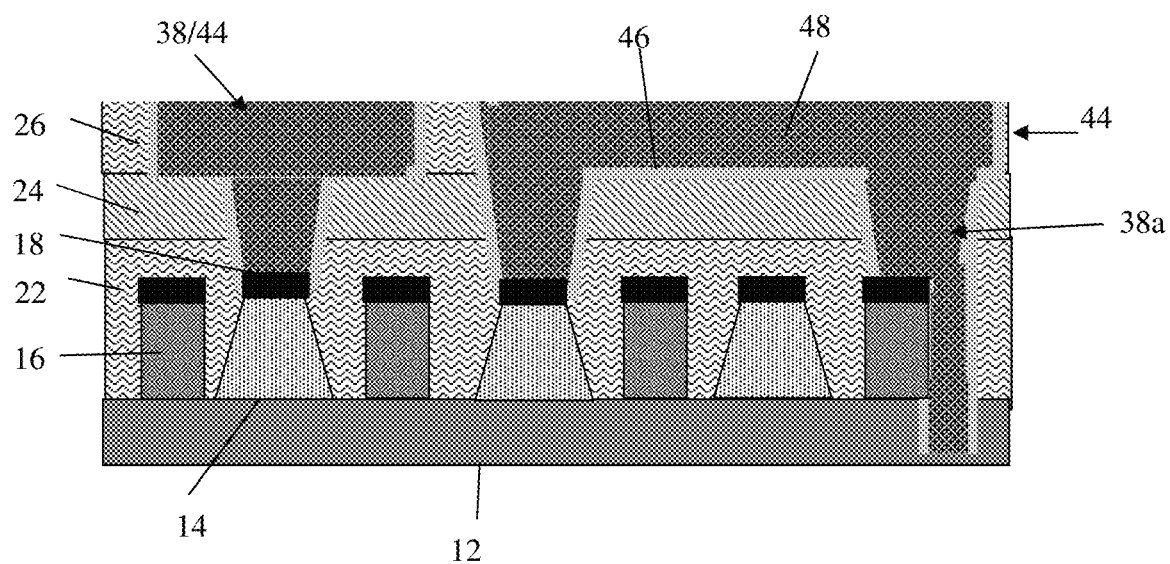

FIGS. 5-7 show a DUV process and resultant structures in accordance with aspects of the present disclosure. In this alternative process, the starting structure is shown in FIG. 1. For example, the structure initially includes a fully depleted semiconductor on insulator (FDSOI) substrate 12 which can be representative of a fin structure fabricated using conventional deposition, lithography and etching processes including, e.g., SIT. Diffusion regions (e.g., source and drain regions) 14 and gate structures 16 are formed on the substrate 12 using the processes as described herein. Silicide contacts 18 are formed on the source and drain regions 14, as well on the gate structures 16. A middle of line (MOL) interlevel dielectric stack of material 20 is deposited on the structure, e.g., over the source/drain regions 14 and structures 16.

In FIG. 5, a trench 38a is formed to the substrate 12 using lithography (DUV) and etching (RIE) processes, where the trench 38a lands on and overlaps with the gate structure 16. The trench 38a also opens to the underlying substrate 12, which can have a depth "x" of 100 nm or more beyond a surface of the gate structure 16. In embodiments, the trench 38a can have a larger critical dimension, e.g., about 2 nm to about 10 nm; compared to conventional processes of record. During the etching process, the materials 28-36 are removed. After the etching process, the resist can be removed by a conventional oxygen ashing process or other known stripants followed by a known cleaning process.

As shown in FIG. 6, the trench 38a is filled with material 42, e.g., SOH. The material 42 can be deposited by any conventional deposition method, e.g., CVD, ALD or PECVD, amongst other deposition processes. After the deposition of the material 42, additional trenches 38 are formed using conventional lithography (DUV) and etching processes, where the additional trenches 38 are etched to expose the silicide 18 of the source and drain regions 14. The additional trenches 38 are then filled with material 42, e.g., SOH.

After the deposition of the material 42, lithography and etching (RIE) processes are performed to form openings 44 in the material 26, which are widen than the upper portions of the trenches (now filled with the material 42). In embodiments, the openings 44 will enlarge the trenches 38, 38a by about an additional, e.g., 2 nm to 10 nm. In embodiments, the openings 44 will enlarge the trenches 38, 38a by about an additional of, e.g., 2 nm to 10 nm. After the etching process, the resist from the lithography process can be removed by a conventional oxygen ashing process or other known stripants followed by a known cleaning process.

As shown in FIG. 7, the material 42 is removed from the trenches 38, 38a using a selective chemistry etching process. A liner 46, e.g., SiN, oxide, nitride or TEOS, is then deposited on the surfaces of the trenches 38, 38a and openings 44. The liner 46 can be deposited to a thickness of about, e.g., 2 nm to about 20 nm and more preferably about 2 nm to about 10 nm. The liner 46 can be deposited using conventional deposition methods, e.g., CVD or ALD. The liner 46 is subjected to an anisotropic etching process, leaving the liner 46 on sidewalls of the trenches 38, 38a and openings 44. A metallization 48, e.g., tungsten, is deposited on the liner 46 and in direct contact with the silicide 18 of the source and drain regions 14 in trench 38 to form a source/drain contact and the gate structures 16 in trench 38a to form a gate contact.

Figure 8:
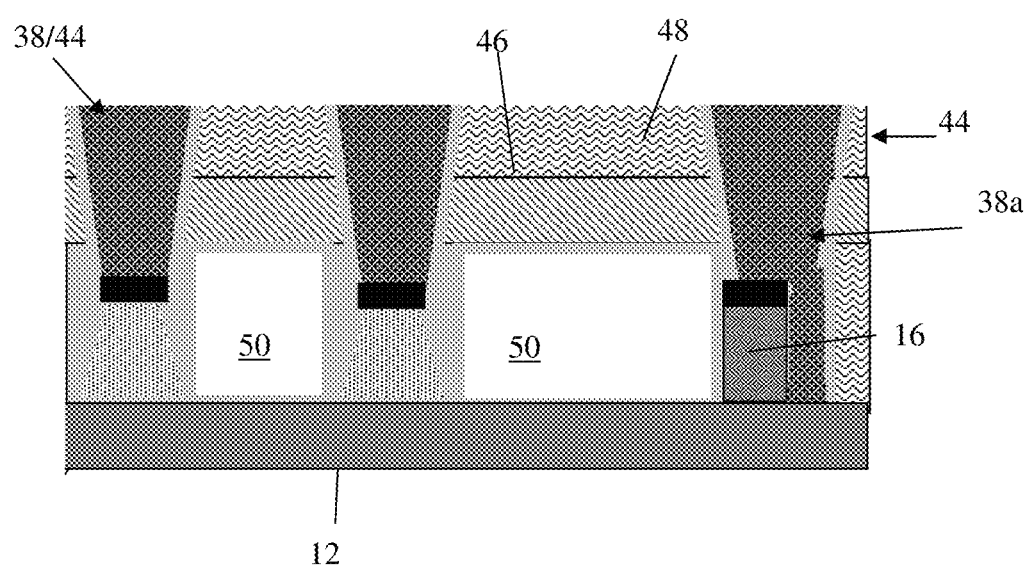
FIG. 8 shows a cross-sectional view of either FIG. 4 or FIG. 7 with voids, amongst other features, and respective fabrication processes in accordance with aspects of the present disclosure.

FIG. 8 shows a cross-sectional view of either FIG. 4 or FIG. 7 with voids, amongst other features, and respective fabrication processes in accordance with aspects of the present disclosure. As shown in FIG. 8, the metallization 48 (e.g., gate contact and source/drain contacts) is lined with the liner 46 and in direct contact with the silicide 18 of the source and drain regions 14 and the gate structures 16. Voids 50 are formed between the source/drain regions 14 and the gate structures 16, and more particularly, the voids 50 will electrically and physically separate the gate contact and source/drain contacts (e.g., metallization 48). The voids are lined with the liner 46, which in combination with the voids eliminates the back gate shorts.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a gate structure comprising source and drain regions;
    a gate contact in direct contact with the gate structure and which extends to an underlying substrate on a side of the gate structure; and
    source and drain contacts directly connecting to the source and drain regions, respectively,
    wherein the gate contact comprises a metallization provided within an opening of a dielectric stack of material in alignment with the gate structure and extending into the underlying substrate on the side of the gate structure.

2. The structure of claim 1, wherein the gate contact and the source and drain contacts are middle of line contacts.

3. The structure of claim 1, wherein the gate contact and the source and drain contacts are lined with a same liner material.

4. The structure of claim 3, wherein the same liner material is on vertical sidewalls of the gate contact and the source and drain contacts.

5. The structure of claim 4, wherein the same liner material is one of SiN, oxide, nitride and tetraethoxysilane (TEOS).

6. The structure of claim 1, wherein the opening is lined with an insulator material below the metallization and extending into the underlying substrate.

7. The structure of claim 6, wherein the opening extends between the gate structure and the source and drain regions.

8. The structure of claim 7, further comprising a void on a side of the gate structure, opposing the metallization that extends into the underlying substrate.

9. The structure of claim 8, wherein the void is lined with the insulator material.

10. The structure of claim 9, wherein the void is lined with the insulator material.

11. The structure of claim 1, further comprising a void on a side of the gate structure, opposing the gate contact, wherein the void is lined with an insulator material.

12. The structure of claim 11, wherein the insulator material lining the void contacts a side of the source and drain regions, the underlying substrate and a bottom surface of a middle of line (MOL) interlevel dielectric stack of material.

13. A structure comprising:
a gate structure comprising source and drain regions;
a gate contact in direct contact with the gate structure and which extends to an underlying substrate on a side of the gate structure; and
source and drain contacts directly connecting to the source and drain regions, respectively,
voids between the source and drain regions and the gate structure, and
wherein the gate contact and the source and drain contacts are lined with a same liner material.

14. The structure of claim 13, wherein the voids electrically separate the gate contact and the source and drain contacts.

15. The structure of claim 14, wherein the same liner material lines the voids.

16. The structure of claim 15, wherein the same liner material is an insulator material.

17. A structure comprising:
a gate structure comprising source and drain regions on a substrate;
a gate contact in contact with the gate structure and the substrate;
source and drain contacts connecting to the source and drain regions, respectively;
a void on a side of the gate structure, the void being surrounded by the substrate, the gate structure and the source and drain regions, and a middle of the line dielectric stack of materials; and
an insulator liner on sidewalls of the gate contact, sidewalls of the source and drain contacts, and sides of the void.

18. The structure of claim 17, wherein the insulator liner lining the void contacts a side of the source and drain regions, the substrate and a bottom surface of a middle of line (MOL) interlevel dielectric stack of material.

* * * * *